United States Patent [19]

Takiguchi

[11] Patent Number: 4,891,581

[45] Date of Patent: Jan. 2, 1990

[54] APPARATUS FOR SAMPLING, ANALYZING AND DISPLAYING AN ELECTRICAL SIGNAL

[75] Inventor: Yoshihiro Takiguchi, Shizuoka, Japan

[73] Assignee: Hamamatsu Photonics Kabushiki Kaisha, Shizuoka, Japan

[21] Appl. No.: 218,795

[22] Filed: Jul. 14, 1988

[30] Foreign Application Priority Data

Jul. 14, 1987 [JP] Japan ................................ 62-175509
Jul. 14, 1987 [JP] Japan ................................ 62-175510

[51] Int. Cl.$^4$ ............................................. G01R 13/00
[52] U.S. Cl. ................................ 324/96; 250/213 VT
[58] Field of Search ................... 324/96; 250/213 VT; 332/7.51; 455/608; 313/381, 384, 389

[56] References Cited

U.S. PATENT DOCUMENTS 4,446,425 5/1984 Valdmanis et al. ................... 324/96
4,740,685 4/1988 Koishi .......................... 250/213 VT

FOREIGN PATENT DOCUMENTS 0197196 10/1986 European Pat. Off. .............. 324/96

OTHER PUBLICATIONS

Tsuchiya, "Advances in Streak Camera Instrumentation for the Study of Biological and Physical Processes", 12/84, vol. QE-20, No. 12, IEEE Journal of Quantum Electronics.

*Primary Examiner*—Ernest F. Karlsen
*Assistant Examiner*—Edward F. Urban
*Attorney, Agent, or Firm*—Finnegan, Henderson, Farabow, Garrett and Dunner

[57] ABSTRACT

An apparatus for sampling, analyzing and displaying an electrical signal as disclosed having a good signal-to-noise ratio and high resolution. The apparatus includes a light pulse source for emitting a light pulse toward the electro-optical surface of a photoelectron sampling tube which in turn emits a photoelectron pulse after receiving the light pulse. The emitted photoelectron pulse is then modulated by a signal to be measured and is accelerated to an anode which may comprise a display for displaying the wave form of the electrical signal as a two-dimensional image.

29 Claims, 7 Drawing Sheets

APPARATUS FOR SAMPLING, ANALYZING AND DISPLAYING AN ELECTRICAL SIGNAL

FIELD OF THE INVENTION

This invention relates to an apparatus for sampling, analyzing and displaying an electrical signal, and more particularly to a photoelectron sampling apparatus capable of analyzing high speed electrical pulse waveforms and displaying an electrical signal as a two-dimensional image.

BACKGROUND OF THE INVENTION

There have been methods of observing high speed phenomena in which a high speed repetitive signal is sampled at a predetermined interval to step down to a predetermined frequency. For example, in one method a sampling pentode utilizing a thermal electron source for analyzing electrical signals is provided, where the grid of the pentode is normally biased to the cutoff region and a current flows when a negative sampling pulse is applied to the cathode. In another method, diodes are arranged to form a mixer circuit and when a sampling pulse is applied to the mixer circuit, a signal current flows due to diode characteristics. In still another method, an electro-optical crystal is used and sampling is effected on the basis of ON/OFF characteristics of the crystal.

However, all of the foregoing methods suffer performance inhibiting disadvantages. In particular, the sampling pentode method utilizing the thermal electron source exhibits poor frequency response to the sampling signal in view of the thermal electron source. The method utilizing the diodes arranged to form the mixer circuit responds to sampling signals of only about 20 ps due to limitations of the diode response characteristics, and also experiences a large amount of jitter. Further, the method utilizing the electro-optical crystal lacks reliability since the crystal is sensitive to temperature and humidity changes. In addition, none of the conventional methods are capable of reading out the waveform of an electrical signal in two-dimensions.

SUMMARY OF THE INVENTION

An object of the present invention is a photoelectron sampling apparatus that overcomes the foregoing problems and disadvantages of prior sampling devices.

A further object of the present invention is a photoelectron sampling apparatus having a good SN ratio.

Another object of the present invention is a photoelectron sampling apparatus for analyzing and displaying an electrical signal having high resolution.

In order to provide the foregoing advantageous features, the photoelectron sampling apparatus of the present invention comprises a light pulse source, a photocathode for receiving a light pulse emitted by the light pulse source, an acceleration electrode for accelerating a photoelectron pulse emitted by the photocathode after receiving the light pulse, a signal electrode for receiving a signal to be measured and for modulating the accelerated photoelectron pulse using the signal to be measured, and an anode electrode for collecting the modulated photoelectron pulse, wherein the waveform of the signal to be measured is sampled by the photoelectron pulse based on a photoelectric effect.

With a photoelectron sampling apparatus according to the present invention, photoelectron pulses ranging in duration from femtoseconds to picoseconds produced when a light pulse of similar duration is incident upon a photocathode, are modulated by an electrical signal to be measured which is applied to a signal electrode. This modulated signal is used to provide the sampled waveform of the electrical signal to be measured. Further, two-dimensional picture information is obtained for every displacement by deflecting the waveform sampled in accordance with the time difference between the sampling signal and the signal to be measured. The waveform of the electrical signal is then converted into a two-dimensional picture image for analyzing and processing.

BRIEF DESCRIPTION OF THE DRAWINGS

The manner by which the above objects and other objects, features, and advantages of the present invention are attained will be fully apparent from the following detailed description when it is considered in view of the drawings, wherein.

DETAILED DESCRIPTION

Figure 1:
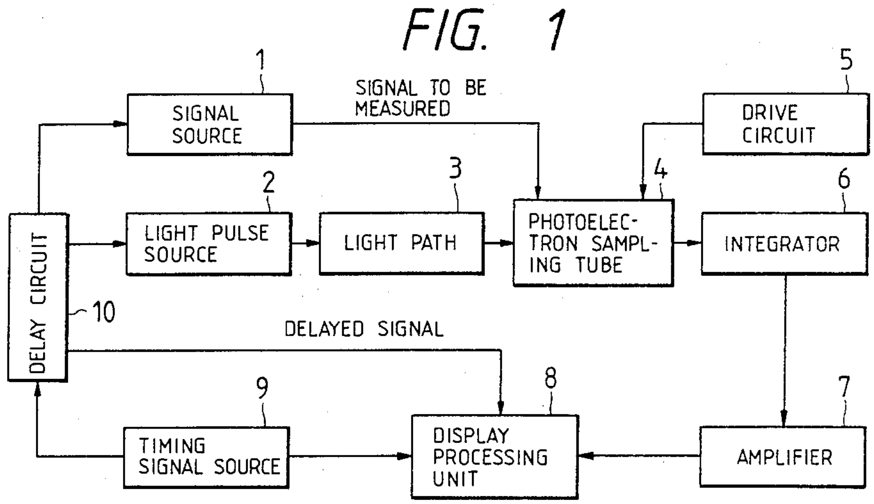
FIG. 1 is a block diagram showing an embodiment of a photoelectron sampling apparatus according to the present invention.

FIG. 1 is a block diagram showing an arrangement of a photoelectron sampling apparatus according to the present invention. In FIG. 1, reference numeral 1 designates a signal source generating a signal to be measured; 2, a light pulse source; 3, a light transmission path; 4, a photoelectron sampling tube; 5, a drive circuit; 6, an integrator; 7, an amplifier; 8, a display processing unit; 9, a timing signal source; and 10, a delay circuit.

In FIG. 1, the light pulse source 2 is, for example, a laser that is synchronized with the signal source 1 by means of a timing signal from the signal source 1. Timing of the generation of the light pulse and the signal to be measured is delayed optically or electrically by the delay circuit 10, which may be varied at will.

The light pulse from the light pulse source 2 is incident upon the photoelectron sampling tube 4 through the light transmission path 3 to generate a photoelectron pulse. The photoelectron pulse is intensity modulated by the signal to be measured. This modulated photoelectron pulse is then multiplied in the sampling tube, integrated by the integrator 6, and amplified by the amplifier 7. In the above embodiment, the time difference between the photoelectron pulse and the signal to be measured, or the phase in which the photoelectron pulse is intensity modulated by the signal to be measured (sampling phase), is varied to reproduce, at the display processing, unit 8, the waveform of the signal to be measured as a function of this time difference.

Figure 2:
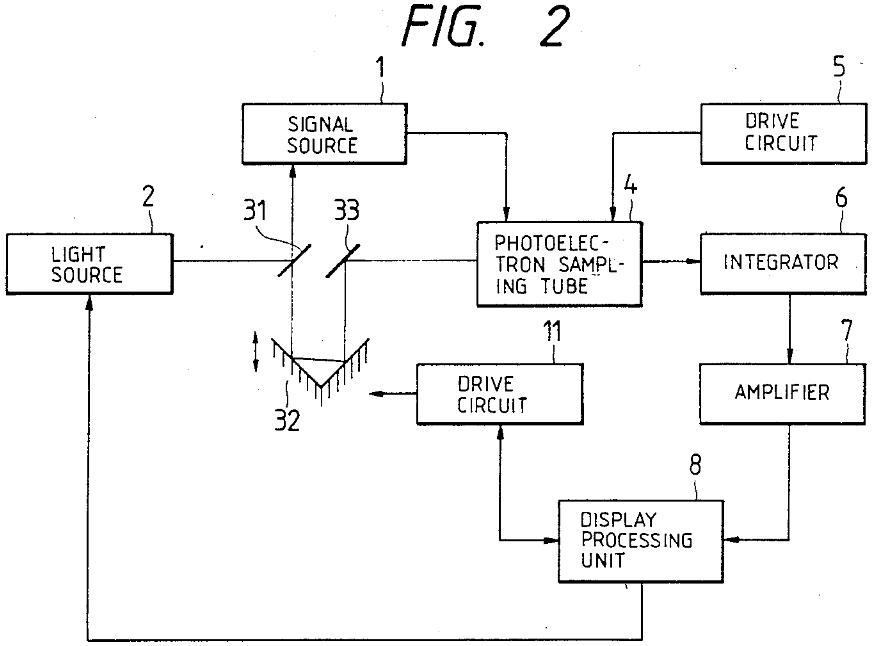
FIG. 2 is a block diagram showing another embodiment of a photoelectron sampling apparatus according to the present invention.

FIG. 2 is a block diagram showing another embodiment of a photoelectron sampling apparatus according to the present invention. In FIG. 2, reference numeral 11 is a drive circuit, 31 is a half mirror, and 32 and 33 are reflectors, with the remaining like reference numerals identifying like components in FIG. 1. In this embodiment, the light pulse source 2 generates a light pulse upon receiving a trigger signal from the display processing unit 8, and the light pulse triggers the source 1 of the signal to be measured in order to synchronize the occurrence of the light pulse, the signal to be measured, and the display processing apparatus. Also, the light pulse incident upon the photoelectron sampling tube 4, is delayed by the optical delay elements formed of the half mirror 31 and the reflectors 32 and 33. The amount of delay can be varied by varying the light transmission length, which is effected by displacing the reflector 32 using the drive circuit 11. At the same time, the signal from the drive circuit 11 is applied to the display processing unit 8 to express, as a function, the timing of occurrence of the signal to be measured and the photoelectron pulse, thereby reproducing the waveform of the signal to be measured. Details of this process will be explained with respect to the embodiment of the present invention shown for example in FIGS. 6–12.

Figure 3:
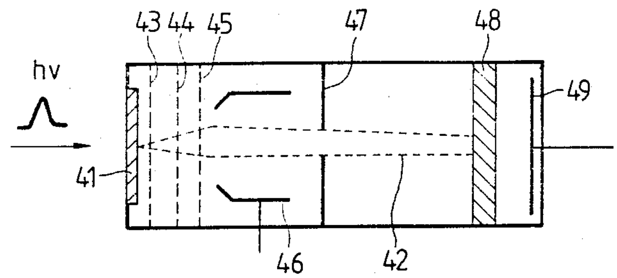
FIG. 3 is a diagram showing an arrangement of a photoelectron sampling tube used in the present invention.
Figure 4:
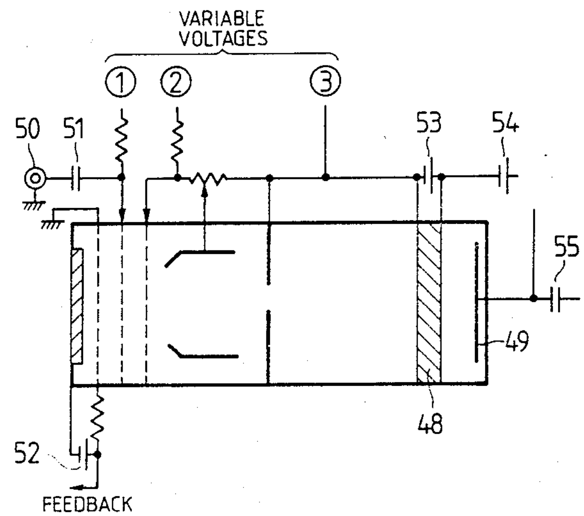
FIG. 4 is a diagram showing an example of voltages applied to the photoelectron sampling tube shown in FIG. 3.
Figure 5:
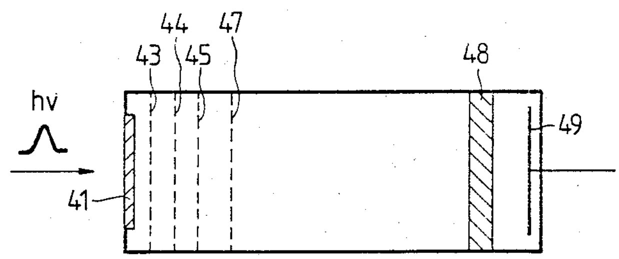
FIG. 5 is a diagram showing a photoelectron sampling tube of a proximate type which requires no focus electrodes.

FIG. 3 is a diagram showing an arrangement of a photoelectron sampling tube used in the present invention, FIG. 4 is a diagram showing an example of voltages applied thereto, and FIG. 5 is a diagram showing an arrangement of a photoelectron sampling tube which needs no focus electrodes. In FIGS. 3, 4 and 5, reference numeral 41 refers to a photocathode; 42, a photoelectron beam; 43, a first acceleration electrode; 44, a signal electrode; 45, a bias electrode; 46, a focus electrode; 47, a second acceleration electrode; 48, a micro-channel plate; 49, an anode; 50, a high frequency connector; 51 and 55 capacitors; and 52, 53 and 54, power supplies. The electrodes 43, 44 and 45 may be of a strip line configuration.

In the photoelectron sampling tube shown in FIGS. 3, 4, and 5, when a short light pulse ranging in duration from femtoseconds to picoseconds is incident upon the photocathode 41 from a laser source (not shown), and a voltage is applied between the photocathode 41 and the first acceleration electrode 43, photoelectron pulses ranging in duration from femtoseconds to picoseconds are extracted from the photocathode 41. In this case, reducing the surface area of the photocathode 41 can present degradation of the SN ratio due to thermal noise. Also, since the pulse duration of the extracted photoelectrons is determined by the electric field strength across the photocathode and the first acceleration electrode, the electric field should be increased to obtain the short photoelectron pulses. For this purpose, the potential of the first acceleration electrode 43 may be set sufficiently high with respect to the potential of the photocathode 41, and/or the distance between the photocathode 41 and the first acceleration electrode 43 may be shortened. If the potential of the first acceleration electrode 43 is to be set high, the power supply 52 may be connected such that the first acceleration electrode 43 is grounded and the photocathode 41 is negative as shown in FIG. 4, thereby preventing return of photoelectrons to the photocathode 41 to assure effective operation.

The photoelectron pulse 42 thus accelerated is modulated by the voltage across the signal electrode 44 and the bias electrode 45. The signal electrode 44 is required to have adequate high frequency characteristics; therefore it is necessary to form the signal electrode 44 of a strip line, while at the same time the distance between the source of the signal to be measured (not shown) and the signal electrode 44 should be as short as possible to prevent distortion of the signal to be measured. The photoelectron pulse 42 is thus modulated by the signal to be measured, and is then accelerated by the focus electrode 46 and the second acceleration electrode 47, which can be adjusted by varying the voltages applied thereto, so as to control the trajectory of the photoelectron pulse 42. The photoelectron pulse 42 is then multiplied by the micro-channel plate 48 to obtain an output from the anode 49. In this case, a pentode is formed by the first acceleration electrode 43, the signal electrode 44, the bias electrode 45, the micro-channel plate 48, and the anode 49; and modulation by the voltage of the signal electrode 44 is directly obtained from the anode 49. The signal thus obtained may then be displayed on a display unit such as a CRT for further analysis.

It should be apparent from the foregoing description that a dynode may be used for multiplication of the photoelectron pulse instead of the micro-channel plate 48. Further, while a short pulse YAG laser, dye laser, or a semiconductor laser may be used as the laser light source, an infrared light is preferably used in order to minimize initial velocity energy distribution of photoelectron. Furthermore, an optical fiber (not shown) may be provided between the laser light source 2 and the photocathode surface 41 to reduce optical loss in transmitting the light pulse.

The detected photoelectron current can be fed back from the first acceleration electrode 43 to the laser light source 2 to promote generation of a constant photoelectron beam. Additionally, a CPU may be used to control the photocathode, the voltage of the acceleration electrodes, the voltage of the electron-multiplying section, the anode voltage, the timing difference between the photoelectron pulse and the signal to be measured, the integration time of the modulated electrical signal from the anode electrode, and the amplification factor of the integrated signal, to provide an automated measurement.

Figure 6:
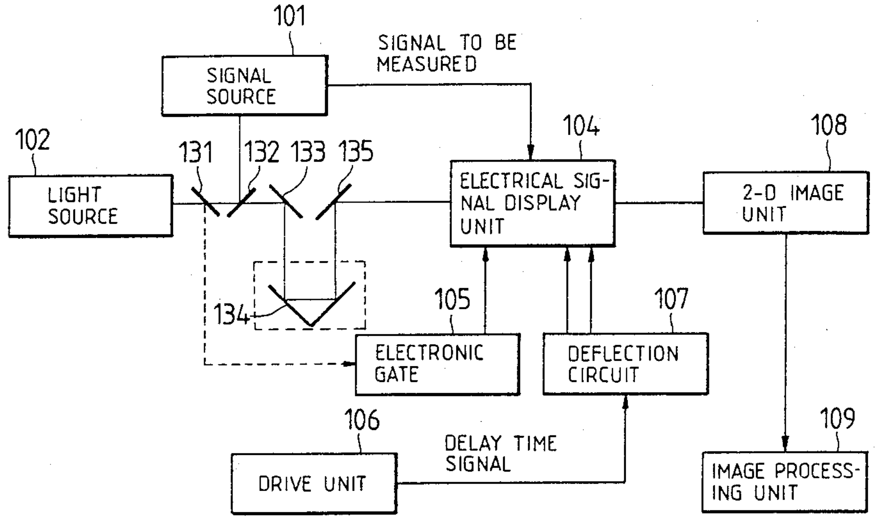
FIG. 6 is a diagram showing an embodiment of an apparatus for analyzing and displaying an electrical signal according to the present invention.

FIG. 6 is a block diagram showing an arrangement of an embodiment of an apparatus for analyzing and displaying an electrical signal according to the present invention. In FIG. 6, reference numeral 101 represents a signal source generating a signal to be measured; 102, a laser light source; 131 and 132, half mirrors, 133, 134, and 135, reflectors; 104, an electrical signal displaying unit; 105, an electronic gate; 106, a drive unit; 107, a deflection circuit; 108, a two-dimensional image unit; and 109, an image information processing unit.

In FIG. 6, the laser light source 102 generates a light pulse, which triggers the signal source 101 through the half mirrors 131 and 132 to generate the signal to be measured in synchronism with the light pulse, while also triggering the electronic gate 105 through the half mirror 131 to turn on the electrical signal displaying unit 104. The light pulse is optically delayed by passing it through reflectors 133, 134 and 135, and is then incident upon the electrical signal displaying unit 104. The amount of delay can be varied by displacing the reflector 134 by means of the drive unit 106, and the deflection voltage, in accordance with the amount of delay, is applied by means of the deflection circuit 107 to the electrical signal displaying unit 104. Although, as described above, the input light pulse to the electrical signal displaying unit 104 is delayed with respect to the signal to be measured, the signal to be measured may instead by delayed with respect to the light pulse to provide the same result.

In this embodiment, the pulse light from the laser light source 102 is delayed optically and is then incident upon the electrical signal display unit 104 to generate a photoelectron pulse while also activating the signal source 101 to provide synchronous operation of the two. The photoelectron pulse is generated, upon incidence of the light pulse, in the electrical signal displaying unit 104 with a predetermined delay time between the signal to be measured and is intensity modulated by the signal to be measured. The modulated photoelectron pulse is then deflected by a deflection voltage (described below) in accordance with the time difference or delay time between the signal to be measured and the photoelectron pulse to provide a display output. In this manner, the photoelectron pulse is modulated by an electrical signal to convert the electrical signal into a two-dimensional image for display. The electrical signal thus converted into the two-dimensional image is output to the two-dimensional image unit 108, and is further processed as two-dimensional image information in the image information processing unit 109. Additionally, the electronic gate 105 is provided to decrease the noise from the photocathode.

Figure 7:
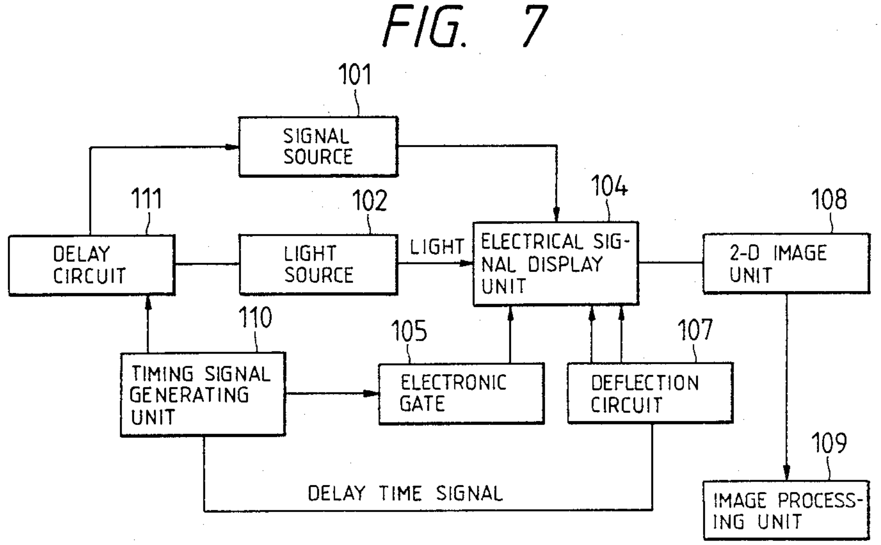
FIG. 7 is a diagram showing another embodiment of an apparatus for analyzing and displaying an electrical signal according to the present invention.

FIG. 7 is a diagram showing another embodiment of an apparatus for analyzing and for displaying an electrical signal according to the present invention. Like reference numerals refer to like components shown in FIG. 6, and reference numeral 110 designates a timing signal generating unit and 111 a delay circuit.

In this embodiment, the timing signal from the timing signal generating unit 110 is applied through the delay circuit 111 to the laser light source 102 and the signal source 101 so as to trigger both of them. In addition, the electronic gate 105 and the deflection circuit 107 are directly activated by the timing signal. The rest of the arrangement and operation is similar to that in FIG. 6.

Figure 8:
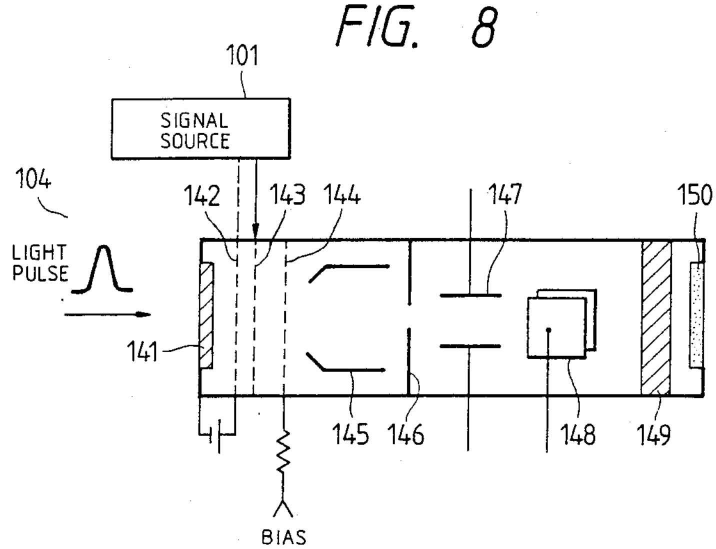
FIG. 8 is a diagram showing an arrangement of an electrical signal displaying unit.

FIG. 8 is a diagram showing an arrangement of an embodiment of an electrical signal display unit 104 which is similar in some respects to the photoelectron sampling tubes shown in FIGS. 3–5. In FIG. 8, reference numeral 141 is a photocathode; 142, a first acceleration electrode; 143, a signal electrode; 144, a bias electrode; 145, a focus electrode; 146, a second acceleration electrode; 147 and 148, deflection electrodes; 149, a two-dimensional electron multiplier; and 150, a phospher screen. The photoelectron pulse is extracted from the photocathode 141 due to incidence of the light pulse thereon and is accelerated by the first acceleration electrode 142 before being modulated by the signal to be measured at the signal electrode 143. The modulation may be effected, for example by performing a triode operation between the bias electrode 144. The electronic gate shown in FIG. 6 is implemented by varying the bias to control conduction of the triode. After the photoelectron pulse is modulated, it is accelerated toward the phospher screen 150 by the focus electrode 145 and the second acceleration electrode 146. Additionally, deflection electrodes 147 and/or 148 may be driven to deflect the photoelectron pulse as necessary. After being deflected, the photoelectron pulse is multiplied by the two-dimensional electron multiplier 149 for example a micro-channel plate, and is then converted into a light image at the phospher screen 150.

As with the embodiments shown in FIG. 1–7, use of a laser light pulse, ranging in duration from femtoseconds to picoseconds, permits analysis of the waveform of an electrical signal ranging from GHz (gigaherte) to the THz (terahertz). In this case, it may be necessary to narrow the spacing between the first acceleration electrode 142 and the photocathode 141, since, as described above, a photoelectron pulse having a short period is generated by increasing the electric field between the photocathode 141 and the first acceleration electrode 142.

Figure 9:
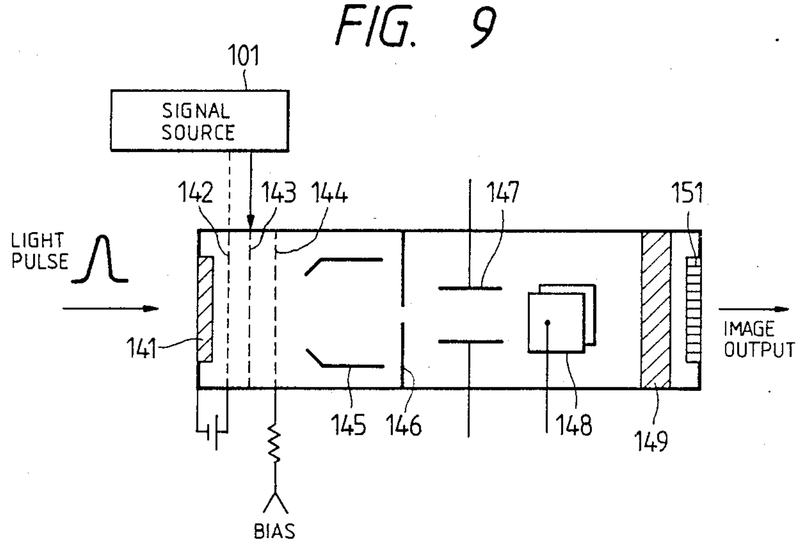
FIG. 9 is a diagram showing another embodiment of an electrical signal displaying unit in which an image information is read out through a semiconductor image device.

FIG. 9 shows another embodiment of the electrical signal display unit 104 in which the image information multiplied by the two-dimensional electron multiplier 149, is read out through a semiconductor image device 151 as a displayed image.

Figure 10:
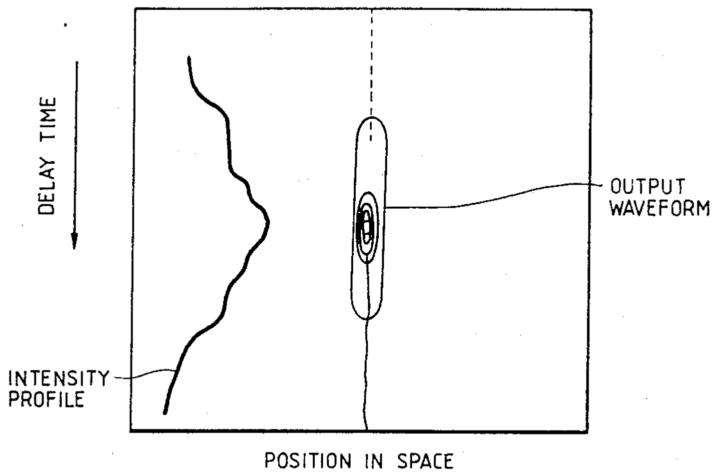
FIG. 10 is a diagram showing an output image when the waveform is deflected in only one direction by the voltage proportional to the delay time.

FIG. 10 shows an example of an output from an electrical signal display unit 104 as shown in FIGS. 8 and 9 for analyzing and displaying the electrical signal. Specifically, FIG. 10 shows an example of an output waveform when the output is deflected in only one direction by the voltage varying in proportion to the delay time. The ordinate shows the difference of the delay time between the signal to be measured and the photoelectron pulse (the sampling phase) and the abscissa shows the position in space. The intensity distribution at any location is shown by the dotted line and the profile of the dotted line corresponds directly to the waveform of the electrical signal.

In addition, deflecting in two directions permits a display of a multi-sampling image at spatially different positions, respectively.

Figure 11:
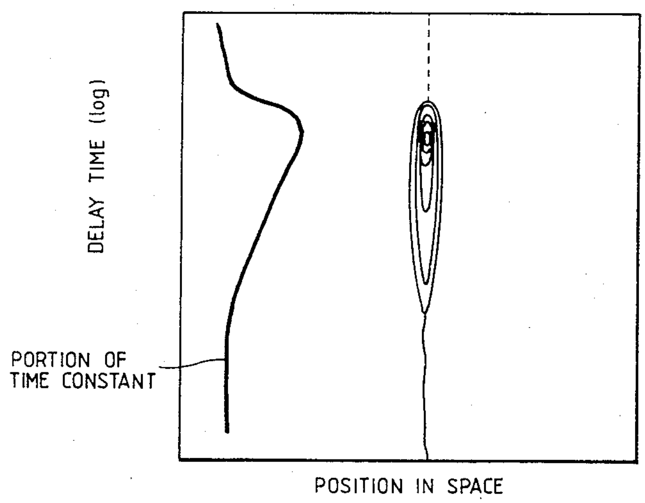
FIG. 11 is a diagram showing an output image when the delay time is given as a logarithmic function.

FIG. 11 shows an output when the delay time is given as a logarithmic function in which the portion decaying exponentially appears to be a straight line. It is during this straight line portion that the time constant and others are directly obtained.

Figure 12:
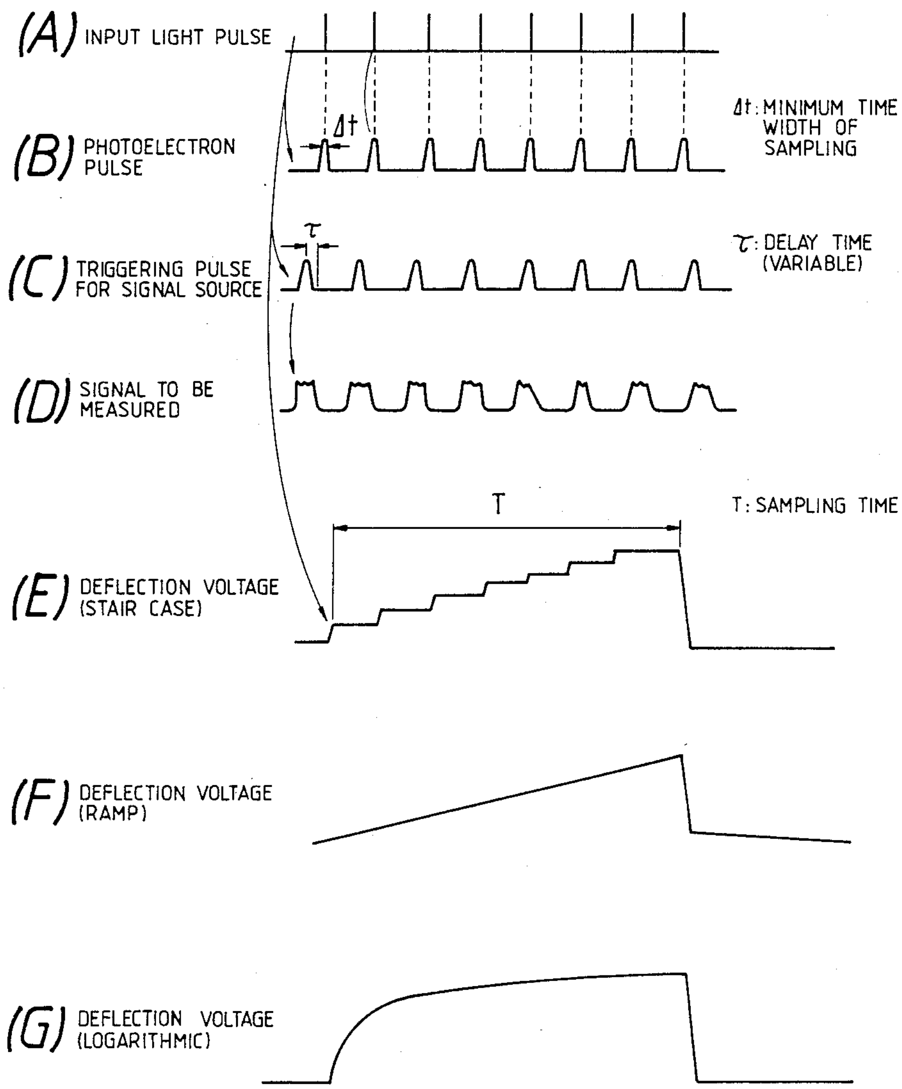
FIGS. 12A, B, C, D, E, F, and G is a diagram showing timing waveforms in an apparatus for analyzing and displaying an electrical signal according to the present invention.

FIG. 12 shows timing waveforms in an apparatus for analyzing and displaying an electrical signal according to the present invention, in which the photoelectron pulse shown at FIG. 12 (B) is generated in synchronism with the input light pulse shown in FIG. 12 (A). In this case, the width, $\Delta t$ of the photoelectron pulse given a minimum time period, however, the image display will be much better if the peak value of the photoelectron pulse is detected. The delay time $\tau$ between the photoelectron pulse and the pulse for triggering the signal to be measured, is scanned with respect to time by a variable delay circuit (FIG. 12 (C)). This trigger pulse causes the signal to be measured to occur (FIG. 12 (D)), and the photoelectron pulse is intensity modulated based on the signal to be measured. At this time, since the phase relation between the signal to be measured and the photoelectron pulse varies in accordance with the delay time $\tau$, the sampling phase with respect to the signal to be measured can be varied. The waveform of the signal to be measured can be reproduced in any desired form by effecting deflection with any of the deflection voltages shown in FIG. 12 (E) to (G) corresponding to the varied delay time. It will be recognized that deflection voltages can be of various other forms such as a sinusoidal voltage or an exponential voltage.

The delay time $\tau$ should be permitted to vary within a range that allows the waveform of the pulse to be measured and sufficiently analyzed. This variation range may be, for example 1/100 or 1% of the width of the signal to be measured.

Additionally, although the above embodiment is arranged in such a way that a sampling electron is obtained from the photoelectron pulse incident upon the photocathode, those of ordinary skill will recognize that a thermal electron source that is produced electrically can also be applied to convert the electrical signal into a two-dimensional image.

Thus, in accordance with the present invention, since the electrical signal to be measured is sampled by the two-dimensional photoelectron pulse, outputting the electrical signal as a two-dimensional image is made possible. Further, generation of the photoelectron pulse using the laser light pulse enables analysis of electrical signal waveforms ranging in frequency from GHz (gigaherte) to the THz (terahertz), in which case, resolution of the analysis is dependent on the pulse width of the photoelectron pulse or the pulse width of the incident light. Since the electrical signal waveform of such a high frequency in a range of picoseconds to femtoseconds can be output in the form of an image, the distortion can be greatly reduced as compared to the distortion according to conventional sampling methods. The waveform can be directly analyzed due to the fact that the deflection voltage can be applied in an arbitrary form, which reduces loads imposed on the subsequent processing systems while also providing a high electron multiplying gain ($10^3$ to $10^5$) with a high SN ration, thereby reducing loads imposed on the reading circuits.

What is claimed is:

1. A photoelectron sampling apparatus comprising:
   - a light pulse source;
   - a photocathode for receiving a light pulse emitted by said light pulse source;
   - an acceleration electrode for accelerating a photoelectron pulse emitted by said photocathode after receiving said light pulse;
   - a signal electrode for receiving a signal to be measured and for modulating the accelerated photoelectron pulse using said signal be measured; and
   - an anode electrode for collecting the modulated photoelectron pulse;
   - wherein the waveform of said signal to be measured is sampled by said photoelectron pulse based on a photoelectric effect.

2. A photoelectron sampling apparatus according to claim 1, wherein said light pulse source is a laser light source for outputting a laser light pulse.

3. A photoelectron sampling apparatus according to claim 2, further comprising means for feeding a detected signal of a photoelectron current existing between said electro-optical surface and said acceleration electrode back to said laser light source to control said laser light source.

4. A photoelectron sampling apparatus according to claim 2, further comprising means for triggering said signal source to generate said signal to be measured and for triggering said laser light source to output said laser light pulse.

5. A photoelectron sampling apparatus according to claim 2, further comprising means responsive to said laser light pulse for triggering said signal source to generate said signal to measured.

6. A photoelectron sampling apparatus according to claim 2, further comprising a delay circuit for each of said light source and said signal source to delay the output of said laser light pulse and said signal to be measured as desired.

7. An apparatus for analyzing and displaying a sampled electrical signal comprising:
   - a sampling means for sampling a signal to be measured utilizing a sampling-electron pulse;
   - delay means for producing a delay time difference between said sampling-electron pulse and said signal to be measured;
   - deflection means for deflecting said sampling-electron in accordance with said delay time difference and for producing a deflection voltage;
   - reading means for displaying two-dimensional image information obtained for each displacement of said sampling-electron pulse due to deflection by said deflection means; and
   - picture information processing means for processing and analyzing said two-dimensional image information.

8. A photoelectron sampling apparatus according to claim 1, wherein a distance between said photocathode and said acceleration electrode is minimized.

9. A photoelectron sampling apparatus according to claim 1, wherein a potential of said acceleration electrode is set sufficiently high with respect to a potential of said photocathode to provide a photoelectron pulse having a period ranging in duration from femtoseconds to picoseconds.

10. A photoelectron sampling apparatus according to claim 1, further comprising a micro-channel plate for multiplying the modulated photoelectron pulse before being collected by said anode.

11. A photoelectron sampling apparatus according to claim 1, further comprising a dynode plate for multiplying the modulated photoelectron pulse before being collected by said anode.

12. An apparatus for analyzing and displaying a sampled electrical signal according to claim 7, further comprising a laser light source for emitting a light laser pulse onto a photocathode so as to generate said sampling-electron pulse.

13. An apparatus for analyzing and displaying a sampled electrical signal according to claim 7, further comprising a thermal electron source for generating said sampling-electron pulse by the use of a voltage generated electrically.

14. An apparatus for analyzing and displaying a sampled electrical signal according to claim 7, wherein said signal to be measured is sampled by modulating the intensity of said sampling-electron pulse based on a voltage of said signal to be measured.

15. An apparatus for analyzing and displaying a sampled electrical signal according to claim 7, wherein said display means includes a phospher screen for converting said two-dimensional image information into an optical image.

16. An apparatus for analyzing and displaying an electrical signal according to claim 7, further comprising a first deflection electrode for deflecting said sampling-electron pulse in a horizontal direction and a second deflection electrode for deflecting said sampling-electron in a vertical direction.

17. An apparatus for analyzing and displaying an electrical signal according to claim 7, further comprising an electronic gate for reducing noise from said photocathode.

18. An apparatus for analyzing and displaying a sampled electron signal according to claim 14, further comprising means for multiplying said sampling-electron pulse in two dimensions, after said sampling-electron pulse is modulated and deflected.

19. A photoelectron sampling apparatus according to claim 1, wherein a distance between a source of said signal to be measured and said signal electrode is set minimized.

20. A photoelectron sampling apparatus according to claim 2, wherein an optical fiber being small in optical loss and high in time-responsibility is used for light transmission between said laser light source and said photocathode.

21. A photoelectron sampling apparatus according to claim 1, further comprising a display means for displaying, as a function, timing difference between said photoelectron pulse and said signal to be measured.

22. An apparatus for analyzing and displaying a sampled electrical signal according to claim 7, wherein said display means includes a semiconductor image device for converting said two-dimensional electron image information into an electrical image.

23. A photoelectron sampling apparatus according to claim 1, wherein the area of said photocathode is minimized.

24. A photoelectron sampling apparatus according to claim 1, wherein an infrared light source is used as said light pulse source so as to make initial velocity energy distribution of said photoelectron narrower.

25. A photoelectron sampling apparatus according to claim 1, wherein said signal electrode is strip line electrode.

26. An apparatus for analyzing and displaying a sampled electrical signal according to claim 15, wherein said optical image is read out to be converted to an electrical signal, said electrical signal being processed in an image processing means.

27. An apparatus for analyzing and displaying a sampled electrical signal according to claim 22, wherein said electrical signal is read out to be processed in an image processing means.

28. An apparatus for analyzing and displaying an electrical signal according to claim 7, further comprising a first deflection electrode for deflecting said sampling-electron in a vertical direction and a second deflection electrode for deflecting said sampling-electron in a horizontal direction.

29. An apparatus for analyzing and displaying a sampled electrical signal according to claim 16, wherein said deflection voltage is applied to at least one of said horizontal and vertical deflection electrodes and is one of a sinusoidal waveform voltage, a ramp waveform voltage, a staircase waveform voltage, a logarithmic waveform voltage and an exponential-function waveform voltage.

* * * * *

UNITED STATES PATENT AND TRADEMARK OFFICE
CERTIFICATE OF CORRECTION

PATENT NO. : 4,891,581

DATED : January 02, 1990

INVENTOR(S) : Yoshihiro Takiguchi

It is certified that error appears in the above-identified patent and that said Letters Patent is hereby corrected as shown below:

In the Claims:

Claim 1, Column 7, Line 56, "signal" should be followed by --to--;

Claim 19, Column 9, Lines 21 - 22, change "is set minimized" to --is minimized--; and Signed and Sealed this Eighteenth Day of August, 1992

*Attest:*

DOUGLAS B. COMER

*Attesting Officer*

*Acting Commissioner of Patents and Trademarks*